(12) United States Patent
Kim et al.

(10) Patent No.: US 11,540,386 B2
(45) Date of Patent: Dec. 27, 2022

(54) FLEXIBLE FILM, FLEXIBLE FILM PACKAGE AND METHOD FOR MANUFACTURING FLEXIBLE FILM

(71) Applicant: Samsung Display Co., Ltd., Yongin-si (KR)

(72) Inventors: Boyeon Kim, Seoul (KR); Myeongsu Kim, Hwaseong-si (KR); Sanghyun Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 334 days.

(21) Appl. No.: 16/450,770

(22) Filed: Jun. 24, 2019

(65) Prior Publication Data
US 2020/0092987 A1 Mar. 19, 2020

(30) Foreign Application Priority Data
Sep. 14, 2018 (KR) .......................... 10-2018-0110308

(51) Int. Cl.
| | | |
|---|---|---|
| H05K 1/00 | (2006.01) | |
| H05K 1/02 | (2006.01) | |
| H05K 3/00 | (2006.01) | |

(52) U.S. Cl.
CPC ......... *H05K 1/0268* (2013.01); *H05K 3/0044* (2013.01); *H05K 1/0277* (2013.01); *H05K 2203/0228* (2013.01); *H05K 2203/163* (2013.01)

(58) Field of Classification Search
CPC .. H05K 1/0268; H05K 3/0044; H05K 1/0277; H05K 2203/0228; H05K 2203/16
See application file for complete search history.

(56) References Cited

U.S. PATENT DOCUMENTS

| | | | |
|---|---|---|---|
| 9,113,545 B2 | 8/2015 | Han et al. | |
| 2005/0061540 A1* | 3/2005 | Parker .................. | H05K 1/0268 174/250 |
| 2010/0012356 A1* | 1/2010 | Hasegawa ............ | H05K 1/0268 174/255 |
| 2012/0161805 A1* | 6/2012 | Jung ..................... | G09G 3/3648 324/754.07 |
| 2015/0325457 A1 | 11/2015 | Kim et al. | |
| 2015/0325461 A1 | 11/2015 | Kim et al. | |
| 2016/0197020 A1* | 7/2016 | Lim ....................... | H01L 23/66 257/48 |
| 2017/0084237 A1 | 3/2017 | Kang | |

(Continued)

FOREIGN PATENT DOCUMENTS

| | | |
|---|---|---|
| JP | 2004317278 A | 11/2004 |
| JP | 2009180601 A | 8/2009 |

(Continued)

*Primary Examiner* — Pete T Lee
(74) *Attorney, Agent, or Firm* — Lewis Roca Rothgerber Christie LLP

(57) ABSTRACT

Provided is a method for manufacturing a flexible film. The method for the manufacturing the flexible film includes providing a parent film on which a plurality of film areas are defined, each of which having a detection pattern formed thereon, applying a voltage to each of the film areas to detect whether a defect exists, removing the detection pattern from respective ones of the film areas on which the defect is detected, and cutting out others of the film areas on which the defect is not detected.

12 Claims, 12 Drawing Sheets

(56) References Cited

U.S. PATENT DOCUMENTS

2018/0151100 A1* 5/2018 Zhou .................... G02F 1/1362
2019/0064256 A1* 2/2019 Wang .................. H01L 27/1262

FOREIGN PATENT DOCUMENTS

| JP | 2009199951 A | 9/2009 |
| JP | 2011171373 A | 9/2011 |
| KR | 10-1324973 B1 | 11/2013 |
| KR | 10-2016-0043259 A | 4/2016 |
| KR | 10-1666711 B1 | 10/2016 |
| KR | 10-1677323 B1 | 11/2016 |
| KR | 10-2017-0034970 A | 3/2017 |
| KR | 10-1838736 B1 | 3/2018 |

* cited by examiner

FLEXIBLE FILM, FLEXIBLE FILM PACKAGE AND METHOD FOR MANUFACTURING FLEXIBLE FILM

CROSS-REFERENCE TO RELATED APPLICATION

This application claims priority to, and the benefit of, Korean Patent Application No. 10-2018-0110308, filed on Sep. 14, 2018, the entire contents of which are hereby incorporated by reference.

BACKGROUND

The present disclosure herein relates to a flexible film, a flexible film passage, a method for manufacturing the flexible film, and a flexible circuit board having improved defect detection accuracy.

Recently, various display devices have become thinner, smaller, and lighter. Thus, various studies have been conducted to mount driving elements, which are for displaying an image on a display device, at a limited area of the display device.

The flexible film may be provided in the form of directly mounting the driving elements for displaying the image on the display device, or in the form of a tape carrier package (TCP) connecting a printed circuit board, on which the driving elements are mounted, to the a display panel.

SUMMARY

The present disclosure provides a flexible film having improved defect detection accuracy.

An embodiment of the present disclosure provides a film package including a base substrate having light transmission and flexibility, and on which a plurality of film areas are arranged in one direction, the film areas each including a line area and a test area, a plurality of circuit lines at the line area, and a detection pattern at the test area, and including a material having a light absorption property.

The film package may further include a plurality of dummy lines adjacent the detection pattern and within the test area.

The detection pattern may have a width that is greater than that of each of the dummy lines.

The test area may include a detection area at which the detection pattern is located, and a dummy area adjacent the detection area, and the film package may further include a plurality of dummy lines at the dummy area.

The dummy lines may be spaced from the detection pattern.

The detection pattern may include the same material as each of the circuit lines.

The base substrate may have a light transmittance of about 30% or more.

The film package may further include a cover member above the circuit lines to cover the circuit lines.

The film package may further include at least one sub-detection pattern at the test area, and including identification information of a respective one of the film areas.

The line area may be provided in plurality, and the test area may be between respective ones of the plurality of line areas on a plane.

The detection pattern may include a defect test detection pattern.

In an embodiment of the present disclosure, a method for manufacturing a flexible film includes providing a parent film on which a plurality of film areas are defined, each of which having a detection pattern formed thereon, applying a voltage to each of the film areas to detect whether a defect exists, removing the detection pattern from respective ones of the film areas on which the defect is detected, and cutting out others of the film areas on which the defect is not detected.

Each of the film areas may include a line area, and a test area adjacent the line area, and providing the parent film may include providing a base substrate having light transmission and flexibility, forming a plurality of circuit lines at the line area, and forming the detection pattern including a material having a light absorption property at the test area.

The detection pattern may include the same material as each of the circuit lines.

The providing of the parent film may further include forming a plurality of dummy lines at the test area.

The providing of the parent film may further include forming at least one sub-detection pattern at the test area.

The sub-detection pattern may include identification information of a respective one of the film areas.

The removing of the detection pattern may include punching the detection pattern to form a punching hole in a corresponding one of the film areas.

The cutting out the others of the film areas may include detecting whether the detection pattern exists such that only the film areas on which the detection pattern is formed are cut out.

In an embodiment of the present disclosure, a flexible film includes a base substrate on which a line area, and a test area adjacent the line area, are defined, the base substrate having light transmission and flexibility, a plurality of circuit lines at the line area, and a detection pattern at the test area, and including a material having a light absorption property.

BRIEF DESCRIPTION OF THE FIGURES

The accompanying drawings are included to provide a further understanding of embodiments of the present disclosure, and are incorporated in and constitute a part of this specification. The drawings illustrate exemplary embodiments of the present disclosure and, together with the description, serve to explain aspects of the present disclosure. In the drawings.

DETAILED DESCRIPTION

Figure 1:
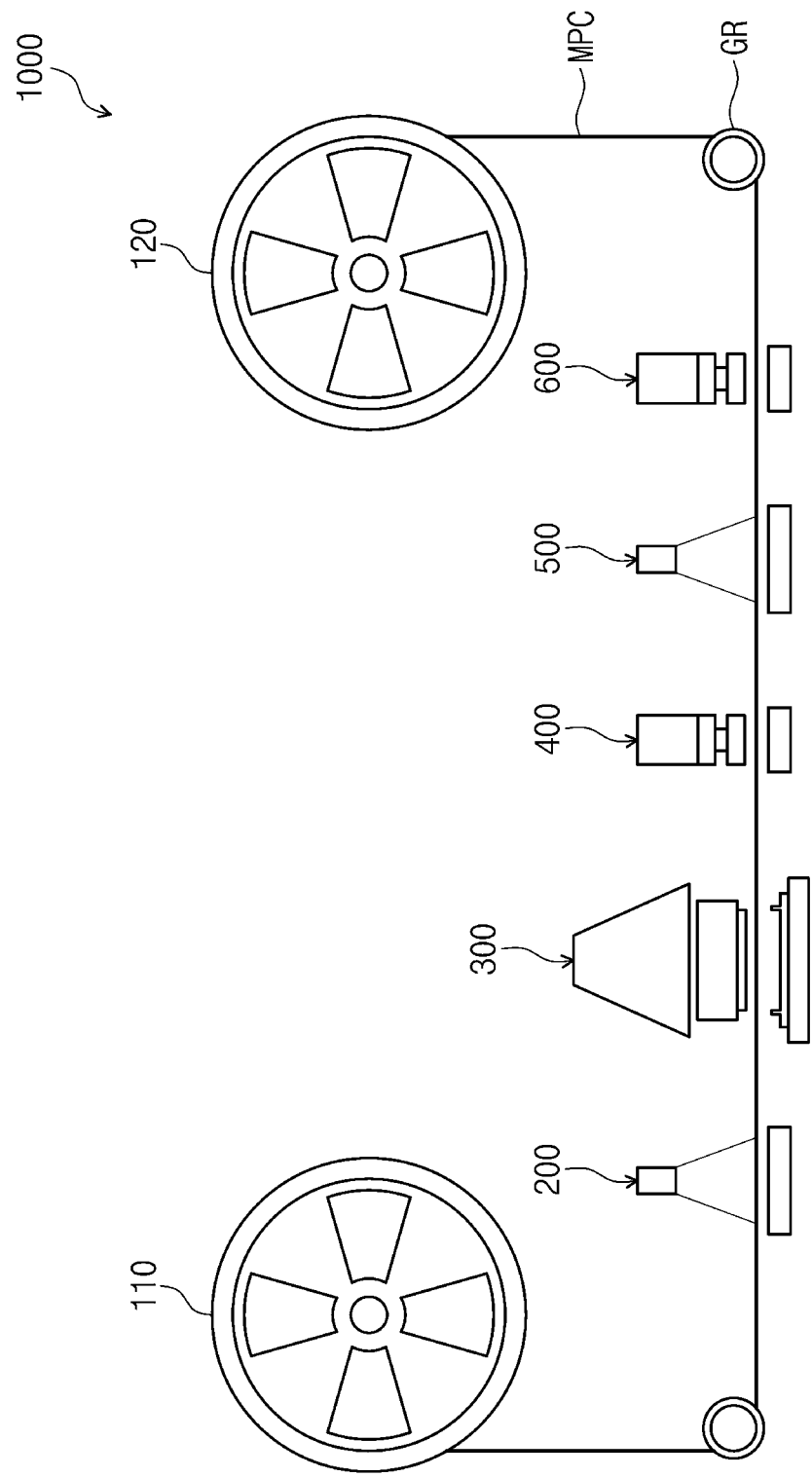
FIG. 1 is a schematic view of an apparatus for manufacturing a flexible film according to an embodiment of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent" and "directly adjacent" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
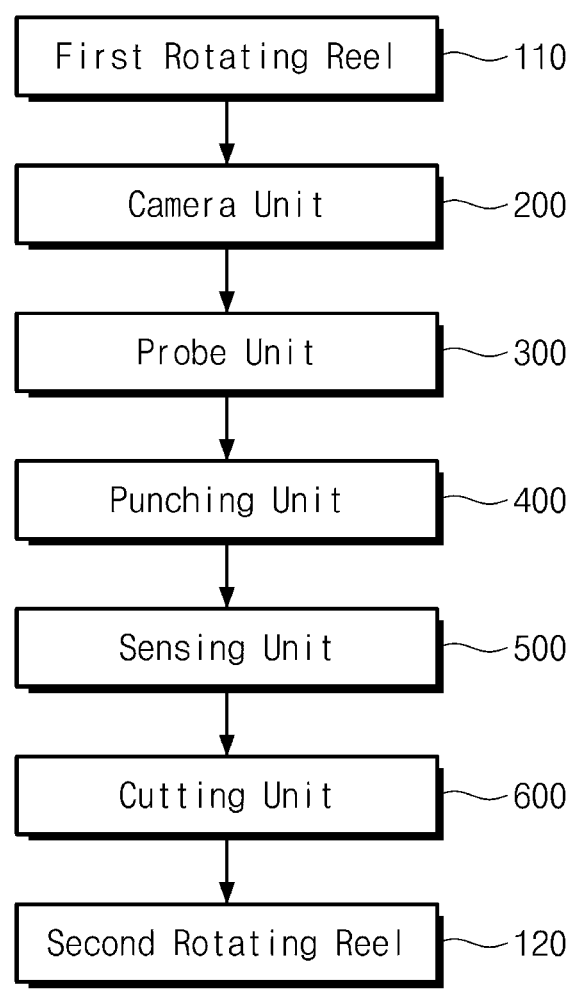
FIG. 2 is a view illustrating a path along which a flexible film package moves according to an embodiment of the present disclosure.

FIG. 1 is a schematic view of an apparatus for manufacturing a flexible film according to an embodiment of the present disclosure, and FIG. 2 is a view illustrating a path along which a flexible film package moves according to an embodiment of the present disclosure.

Referring to FIGS. 1 and 2, an apparatus 1000 for manufacturing a flexible film according to an embodiment may be an apparatus for manufacturing a plurality of flexible films FPC (see FIGS. 15 and 16) by using a film package MPC. For example, the apparatus 1000 for manufacturing the flexible film according to an embodiment of the present disclosure may transfer the film package, may detect whether a plurality of areas defined on the film package are defective, and may sort the defective areas to manufacture the flexible film.

The apparatus 1000 for manufacturing the flexible film includes a first rotating reel 110, an image sensor/camera 200, a probe 300, a punch/punch press 400, a sensor 500, a cutter 600, and a second rotating reel 120.

The first rotating reel 110 provides the film package MPC. The film package MPC may be initially provided in a state of being wound around the first rotating reel 110. As the first rotating reel 110 rotates (e.g., in a predetermined direction), the film package MPC may be unwound from the first rotating reel 110.

The second rotating reel 120 may collect the film package MPC that is unwound from the first rotating reel 110. As the second rotating reel 120 rotates (e.g., in a predetermined direction), the film package MPC may be wound around the second rotating reel 120. The rotating directions of the first rotating reel 110 and the second rotating reel 120 are not specifically limited.

In the apparatus 1000 for manufacturing the flexible film, each of the first rotating reel 110 and the second rotating reel 120 may include a driver (e.g., a rotational driver) for allowing each of the first rotating reel 110 and the second rotating reel 120 to rotate.

Each of the above-described first rotating reel 110 and the second rotating reel 120 is merely an example for transferring the film package MPC, and thus, the embodiment of the present disclosure is not specifically limited to any particular type of unit or method for transferring the film package MPC. According to another embodiment of the present disclosure, the first rotating reel 110 and the second rotating reel 120 may be omitted.

The camera 200, the probe 300, the punch press 400, the sensor 500, and the cutter 600 may be located between the first rotating reel 110 and the second rotating reel 120. The film package MPC unwound from the first rotating reel 110 is wound around the second rotating reel 120 after sequentially passing through the camera 200, the probe 300, the punch press 400, the sensor 500, and the cutter 600.

The apparatus 1000 for manufacturing the flexible film according to an embodiment of the present disclosure may further include a mover, or transporter. The transporter may support the film package MPC, and may allow the film package MPC to move so that the film package MPC passes through or past the camera 200, the probe 300, the punch press 400, the sensor 500, and the cutter 600 located between the first rotating reel 110 and the second rotating reel 120. For example, the transporter may be a conveyor belt or a movable stage.

The apparatus 1000 for manufacturing the flexible film according to an embodiment of the present disclosure may further include at least one guide roller GR. A guide roller GR may be located at a front side of and a rear side of the camera 200, the probe 300, the punch press 400, the sensor 500, and the cutter 600, collectively, to guide a position of the film package MPC.

Also, the apparatus 1000 for manufacturing the flexible film according to an embodiment of the present disclosure may further include a controller. The controller may receive information from the camera 200, the probe 300, and the sensor 500, and may control operations of the punch press 400 and the cutter 600. Also, the controller may control the above-described driver(s) for rotating the first and second rotating reels 110 and 120.

Figure 3:
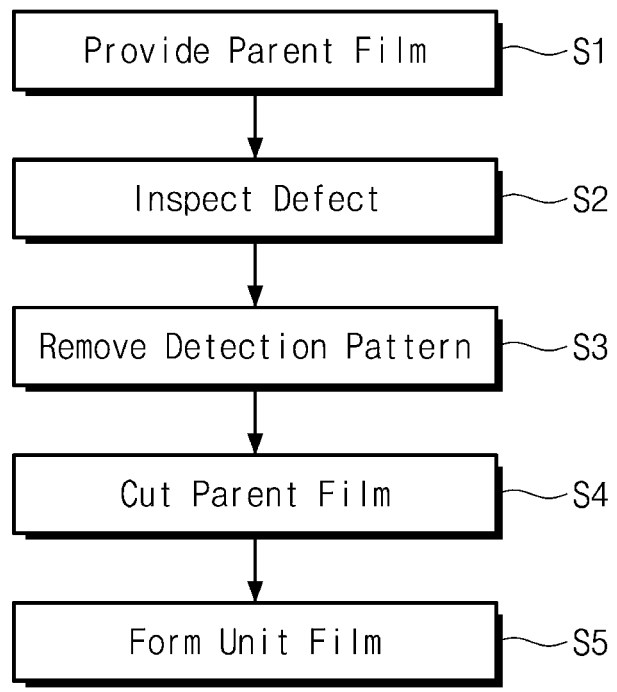
FIG. 3 is a flowchart illustrating a method for manufacturing the flexible film according to an embodiment of the present disclosure.

FIG. 3 is a flowchart illustrating a method for manufacturing the flexible film according to an embodiment of the present disclosure. Hereinafter, a method for manufacturing the flexible film according to an embodiment of the present disclosure will be described later together with the apparatus 1000 for manufacturing the flexible film illustrated in FIGS. 1 and 2.

The method for manufacturing the flexible film, according to an embodiment of the present disclosure, includes a process S1 of providing a parent film, a process S2 of inspecting whether each of a plurality of areas defined on the parent film is defective, a process S3 of removing a detection pattern of the areas on which the defects are detected, and processes S4 and S5 of cutting the areas on the parent film on which the defects are not detected to form a unit film.

Figure 4:
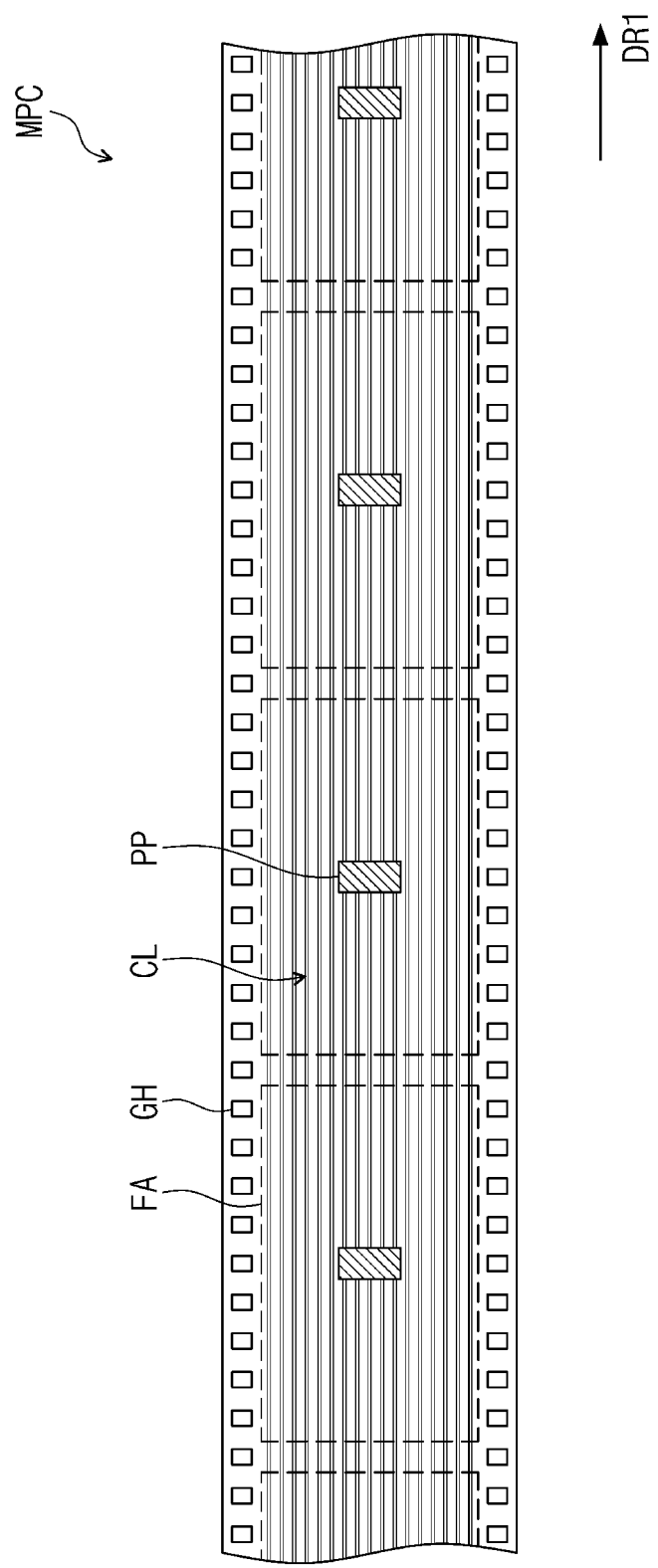
FIG. 4 is a plan view of a parent film according to an embodiment of the present disclosure.

FIG. 4 is a plan view of a parent film according to an embodiment of the present disclosure.

Referring to FIGS. 1 to 4, in the process S1 of providing the parent film, the parent film may be the film package MPC on which a plurality of film areas FA are defined. The parent film MPC may extend in one direction. The one direction may be defined as a first direction DR1. The plurality of film areas FA may be defined on a plane defined by the parent film MPC. The film areas FA may be arranged to be spaced apart from each other in the first direction DR1 that is the extension direction of the parent film MPC.

A plurality of guide holes GH arranged in the first direction DR1 may be defined in the vicinity of the plurality of film areas FA. In an embodiment of the present disclosure, the guide holes GH may be coupled to, or held by portions of, the first and second rotating reels 110 and 120 so that the parent film MPC is easily wound/unwound around/from the first and second rotating reels 110 and 120. Also, the guide holes GH may be coupled to, or held by, a portion of the transporter so that the parent film MPC is fixed to the transporter to move.

In the present embodiment, although the parent film MPC having the shape that extends in one direction is described as an example, the shape of the parent film MPC and the arrangement relationship of the film areas FA are not specifically limited.

Figure 5:
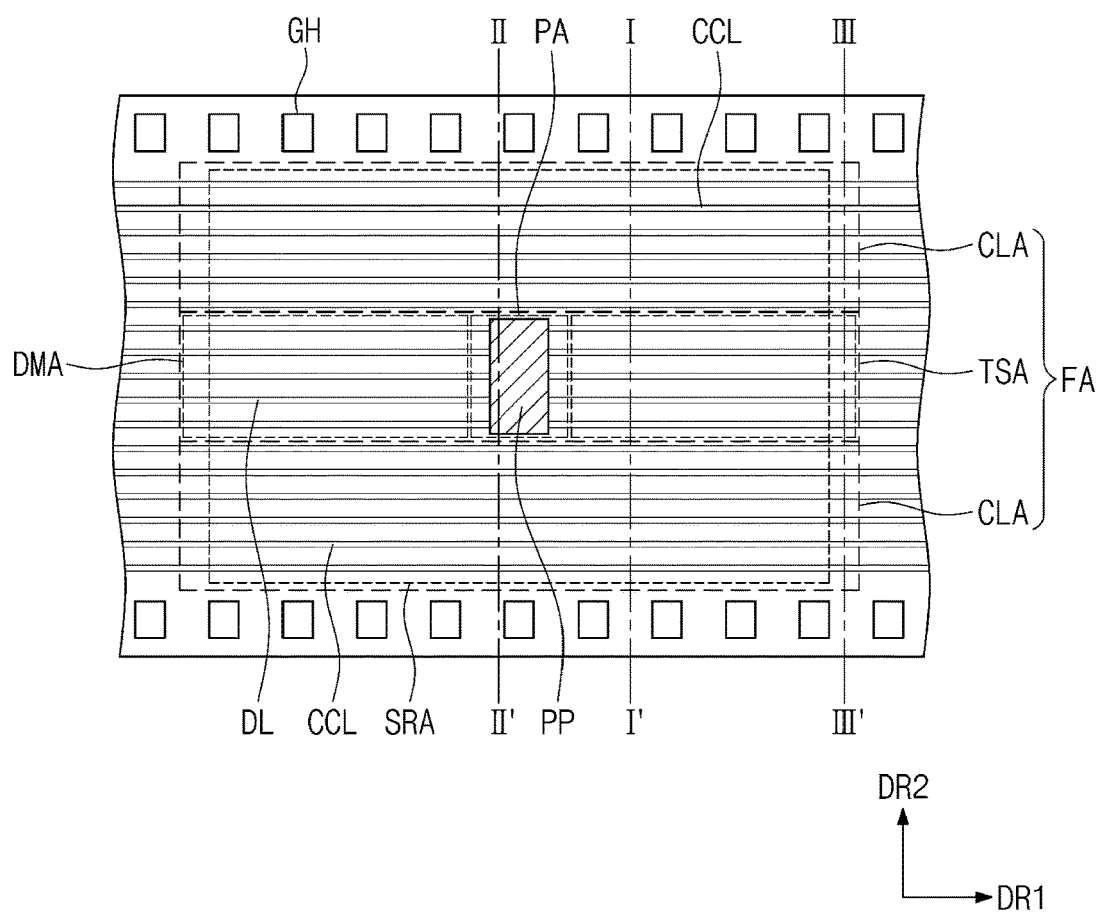
FIG. 5 is an enlarged plan view of one film area illustrated in FIG. 4.

FIG. 5 is an enlarged plan view of one film area illustrated in FIG. 4.

Referring to FIG. 5, each of the film areas FA defined on the parent film MPC includes at least one line area CLA and a test area TSA. In FIG. 5, a case in which the line area CLA is provided in plurality is illustrated. For example, the test area TSA may be between two line areas CLA. The line areas CLA and the test area TSA are arranged in a second direction that is substantially perpendicular to the first direction DR1 on the plane.

The test area TSA includes a detection area PA and a dummy area DMA, which are arranged in the first direction DR1. The detection area PA may be at a center of the test area TSA. The dummy area DMA is adjacent the detection area PA. In the present embodiment, the dummy area DMA is provided in plurality. The dummy areas DMA face each other in the first direction DR1 with the detection area PA therebetween.

Figure 6:
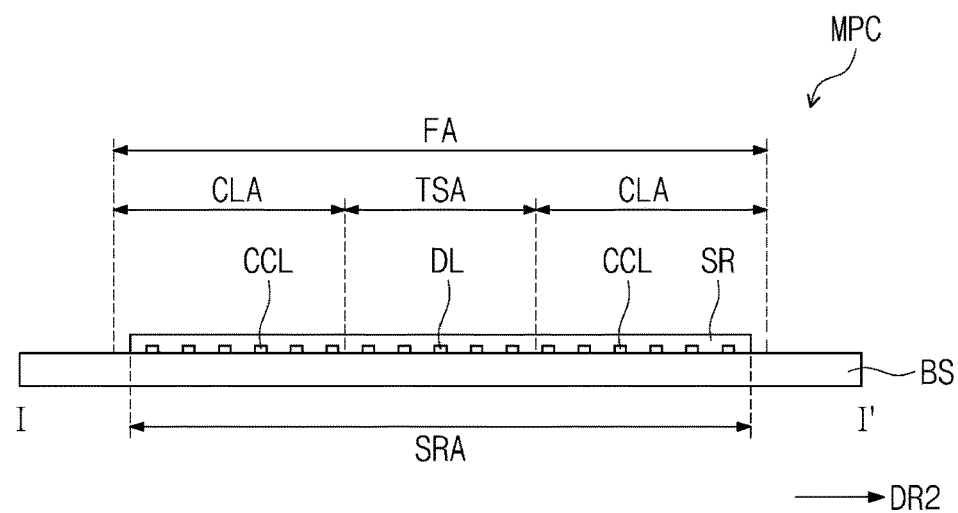
FIG. 6 is a cross-sectional view taken along the line I-I' of FIG. 5.
Figure 7:
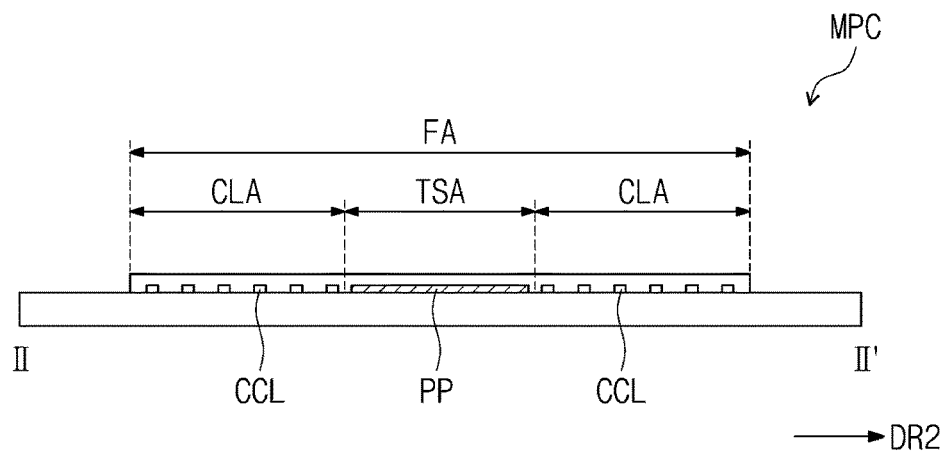
FIG. 7 is a cross-sectional view taken along the line II-II' of FIG. 5.
Figure 8:
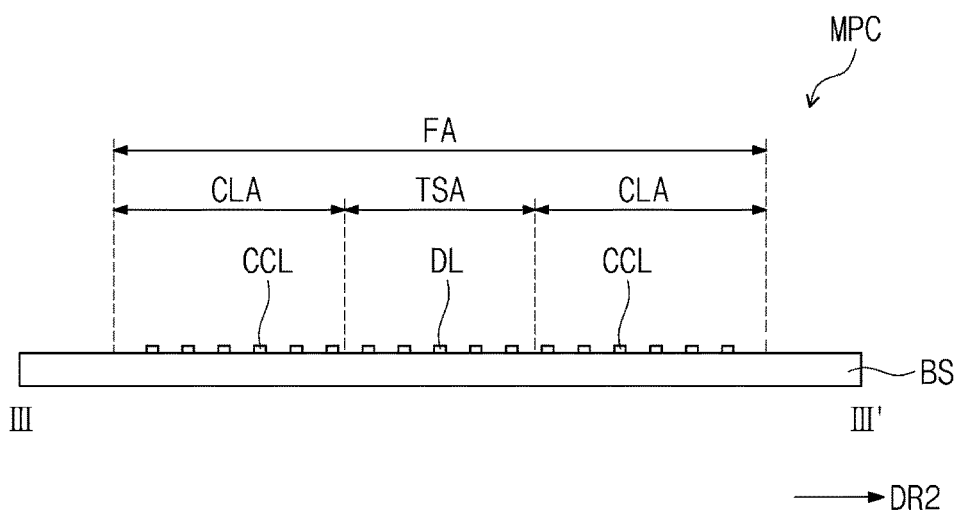
FIG. 8 is a cross-sectional view taken along the line III-III' of FIG. 5.

FIGS. 6 to 8 are cross-sectional views taken along the lines I-I', II-II', and III-III' of FIG. 5.

Referring to FIGS. 6 to 8 together with FIGS. 4 and 5, the process S1 (see FIG. 3) of providing the parent film MPC, according to an embodiment of the present disclosure, may include a process of providing a base substrate BS, a process of forming a line part CL (see FIG. 9), and a process of forming a detection pattern PP (e.g., a defect detection pattern, or defect test detection pattern). That is, the parent film MPC, according to an embodiment of the present disclosure, includes the base substrate BS, the line part CL, and the detection pattern PP.

The base substrate BS defines a base layer of the parent film MPC. The base substrate BS may have flexibility. For example, the base substrate BS includes a plastic material. For example, the base substrate BS may include polyimide (PI). Also, in the present embodiment, the base substrate BS may have light transmission. For example, the base substrate BS may have a light transmittance of about 30% or more.

The line part CL is located on the base substrate BS. The line part CL includes a plurality of circuit lines CCL and a plurality of dummy lines DL. The circuit lines CCL are located on the line areas CLA, respectively. The circuit lines CCL respectively extend from the line areas CLA in the first direction, and are arranged to be spaced apart from each other in the second direction. Each of the circuit lines CCL includes a metal material. For example, each of the circuit lines CCL may include copper (Cu).

The dummy lines DL are formed on respective dummy areas DMA of the test area TSA. The dummy lines DL respectively extend from the dummy areas DMA in the first direction DR1, and are arranged to be spaced apart from each other in the second direction.

Each of the dummy lines DL may include the same material as each of the circuit lines CCL. The dummy lines DL may be formed together with the circuit lines CCL so that the circuit lines CCL are easily formed on the base substrate BS. The embodiments of the present disclosure are not specifically limited to the shape or the arrangement relationship of the dummy lines DL. Also, in another embodiment of the present disclosure, the dummy lines DL may be omitted.

After the circuit lines CCL and the dummy lines DL are formed, the detection pattern PP may be formed. In other embodiments of the present disclosure, the process of forming the detection pattern PP may be performed before the process of forming the line part CL, or may be performed at the same time with the process of forming the line part CL.

The detection pattern PP is located on the detection area PA of the test area TSA. In the present embodiment, the detection pattern PP has a rectangular shape. However, the embodiments of the present disclosure are not specifically limited to the shape of the detection pattern PP.

In the present embodiment, the detection pattern PP includes a material having a light absorption property. For example, the detection pattern PP may include the same material as the circuit lines CCL and the dummy lines DL.

In the present embodiment, a width of the detection pattern PP in the second direction DR2 may be greater than that of each of the dummy lines DL. Thus, a light absorption rate per unit area on the detection area PA may be greater than that per unit area on the dummy area DMA.

The detection pattern PP displays information of each of the film areas FA. In the present embodiment, the information may include information with respect to whether the corresponding film area FA is defective.

In the present embodiment, at least a portion of the dummy lines DL may be located on the detection area PA. In this case, the dummy lines DL may be connected to the detection pattern PP.

The film area FA according to an embodiment of the present disclosure may further include a solder area SRA. The solder area SRA may cross the line area CLA and the test area TSA. The solder area SRA may be defined on an area not including edge areas of the film area FA in the first direction DR1.

The parent film MPC according to an embodiment of the present disclosure may further include a cover member SR. The cover member SR is located above the circuit lines CCL, the dummy lines DL, and the detection pattern PP to cover a portion of the circuit lines CC, a portion of the dummy lines DL, and the detection pattern PP. The cover member SR corresponds to, or entirely overlaps, the solder area SRA.

The cover member SR protects the circuit lines CCL against the outside (e.g., from impurities). Thus, according to the present embodiment, a short-circuit of the flexible film, which will be described later, may be avoided or prevented from occurring.

Both ends of each of the dummy lines DL and the circuit lines CCL that do not overlap the solder area SR in the first direction DR1 may be exposed to the outside by the cover member SR. The ends of the circuit lines CCL may serve as connectors that electrically connect the display panel DP (see FIGS. 14 and 15), which will be described later, to the printed circuit board PCB (see FIGS. 14 and 15), which will also be described later.

Referring again to FIGS. 1 to 4, the parent film MPC that is provided in the state of being unwound from the first rotating reel 110 is supplied to the camera 200. The camera 200 receives position information of the film areas FA of the parent film MPC provided to, or below, the camera 200. The camera 200 transmits the position information of the film areas FA to the controller. The controller may control a rotation direction and speed of each of the first rotating reel 110 and the second rotating reel 120 by using the position information of the film areas FA. That is, the controller may control a transfer speed of the parent film MPC by using the information received from the camera 200.

The parent film MPC passing through, or past, the camera 200 may undergo the process S2 of detecting the defects. The process S2 of detecting the defects may be performed by the probe 300. The probe 300 may supply current to each of the film areas FA of the parent film MPC to detect whether any of the film areas FA are defective. The areas on which the defect test is not performed may be the line areas CLA. The defect test may be performed on the test area TSA by the probe 300. The defect information detected by the probe 300 is transmitted to the controller. The defect information is stored in the controller.

Figure 9:
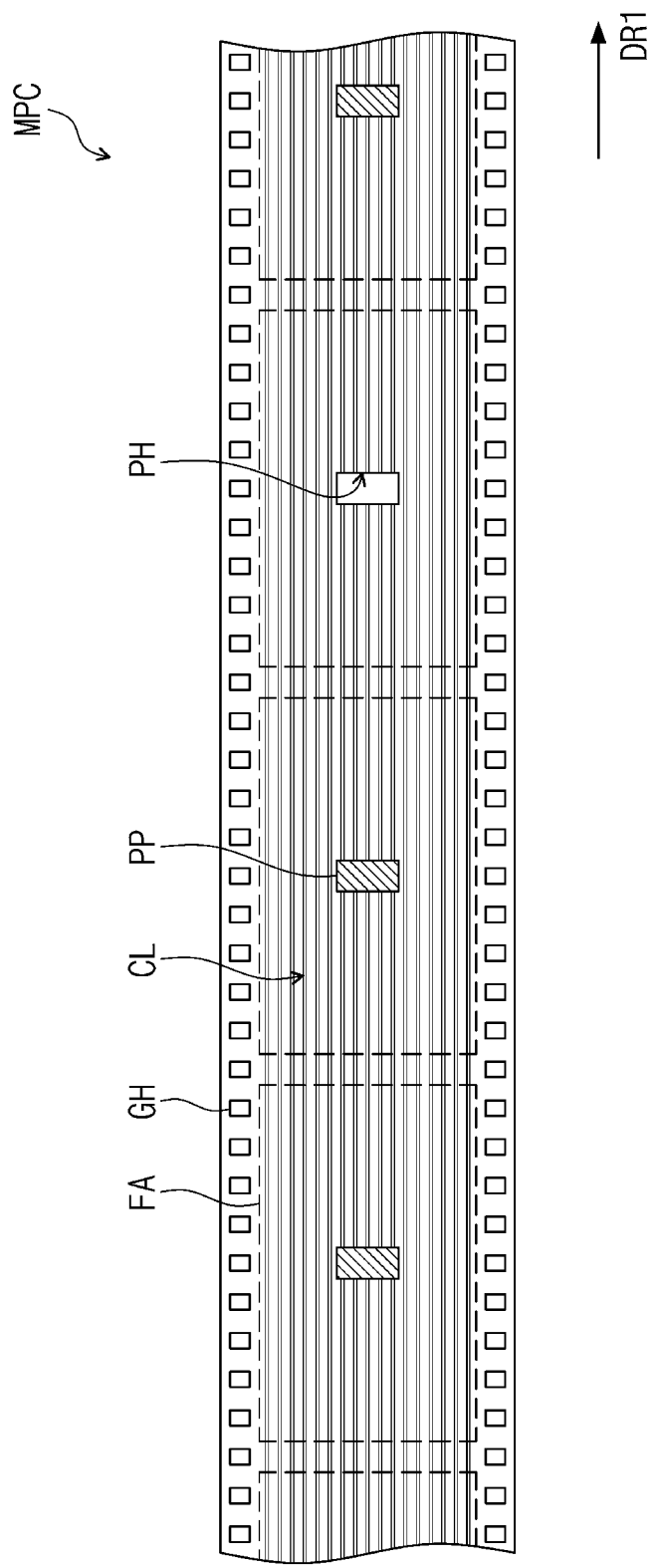
FIG. 9 is an enlarged plan view of the parent film that has undergone a punching process.

FIG. 9 is an enlarged plan view of the parent film that has undergone the punching process.

Referring to FIG. 9, the parent film MPC passing through the probe 300 is supplied to the punch press 400. The detection pattern PP formed on the detection area PA may be removed by the punch press 400 (S3, see FIG. 3). The punch press 400 may receive the defect information from the controller to punch (e.g., punch out) the detection pattern PP, which is formed on the detection area PA included in the film area FA, and on which the defects are detected, (see FIG. 4). A punching hole PH is defined in the detection area PA, and as an area at which the detection pattern is removed. That is, according to the present embodiment, the punching hole PH may be formed in the detection area PA of the film area FA on which the defect is detected, thereby displaying the defect on the film area FA.

Figure 10:
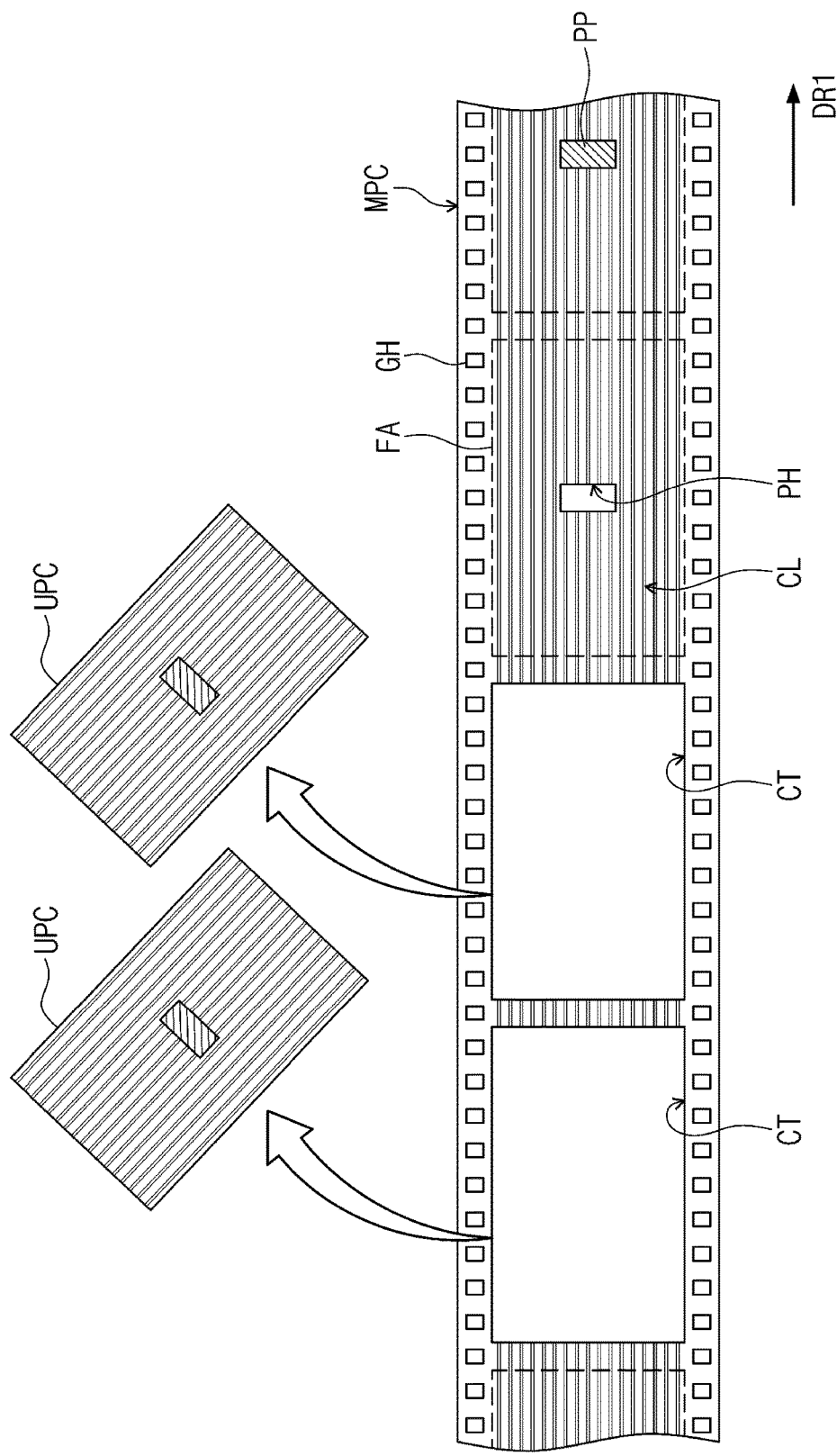
FIG. 10 is an enlarged plan view of the parent film that has undergone a cutting process.
Figure 11:
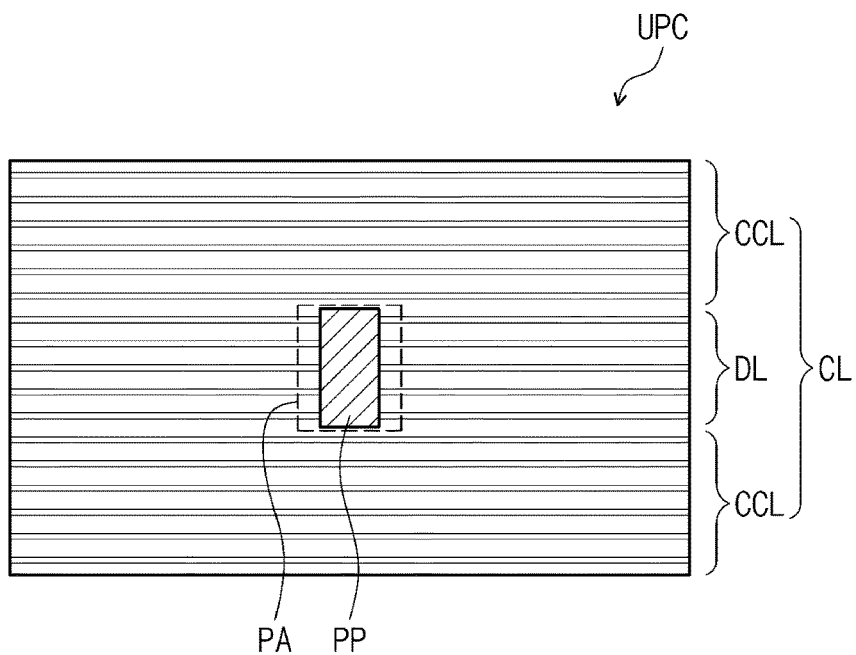
FIG. 11 is an enlarged plan view of a unit film according to an embodiment of the present disclosure.

FIG. 10 is an enlarged plan view of the parent film that has undergone the cutting process, and FIG. 11 is an enlarged plan view of the unit film according to an embodiment of the present disclosure.

Referring to FIGS. 10 and 11, the parent film MPC passing through, or past, the probe 300 is supplied to the punch press 400. The sensor 500 may determine whether a punching hole PH exists in the detection area PA for each of the plurality of film areas FA. For example, the sensor 500 may be a camera or an infrared camera. The information corresponding to a determination of whether the punching hole PH exists is transmitted and stored in the controller.

The parent film MPC passing through, or past, the sensor 500 is supplied to the cutter 600. The cutter 600 receives the information, which indicates whether the punching hole PH exists, from the controller, and may cut out the film areas FA in which no punching hole PH is formed. That is, the cutter 60 may cut the film area FA on which the detection pattern PP is formed, but might not cut the film area FA in which the punching hole is formed due to the removal of the detection pattern PP. The cutter 600 may cut the film area FA along a cutting line. The cutting line may correspond to a boundary of the film area FA. A cutting hole CT may be defined in an area of the parent film MPC from which the cut film area FA is removed.

The cut and removed film area FA is defined as a unit film UPC (S5). The unit film UPC may serve as a flexible film FPC that will be described later. The parent film MPC in which the cutting hole CT is formed is collected by the second rotating reel 120 (see FIGS. 1 and 2).

Unlike the present embodiment, when the parent film MPC does not include the detection pattern PP, a difference between a light transmittance of the detection area PA in which the punching hole PH is formed, and a light transmittance of the detection area PA from which the punching hole PH is removed, may be relatively small due to the base substrate BS being transparent. That is, the accuracy may be lowered when the sensor 500 determines whether the punching hole PH is formed in the film areas FA of the parent film MPC.

However, according to an embodiment of the present disclosure, because the detection pattern PP having the light absorption rate is located on the detection area PA, the difference between the light transmittance of the detection area PA in which the detection pattern PP is formed, and the light transmittance of the detection area PA from which the detection pattern PP is removed due to the punching hole PH, may increase. Thus, according to the present embodiment, when the flexible film FPC (see FIGS. 15 and 16) is manufactured, the defect detection accuracy of the flexible film FPC may be improved.

Figure 12:
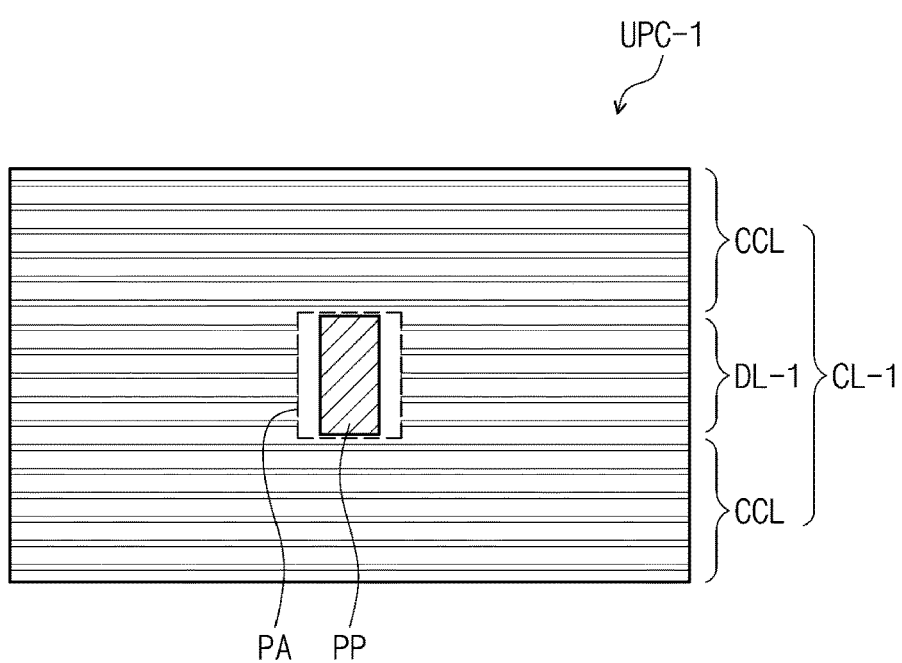
FIG. 12 is an enlarged plan view of a unit film according to another embodiment of the present disclosure.

FIG. 12 is an enlarged plan view of a unit film according to another embodiment of the present disclosure.

For convenience of description, differences between the present embodiment and the foregoing embodiments will be mainly described, and omitted descriptions may be derived from the descriptions of foregoing embodiments. Also, the same reference symbols are given to the same components, respectively, and duplicated descriptions will be omitted.

Referring to FIG. 12, dummy lines DL-1 of a unit film UPC-1 according to another embodiment of the present disclosure may be located to be spaced apart from a detection pattern PP. For example, the dummy lines DL-1 are spaced apart from the detection pattern PP in the first direction DR1 (see FIG. 5). In this case, the dummy lines DL-1 may not overlap the detection area PA.

According to the present embodiment, a position of the detection area PA may be more clearly distinguished. Thus, the defect detection accuracy of the flexible film may be more improved.

Figure 13:
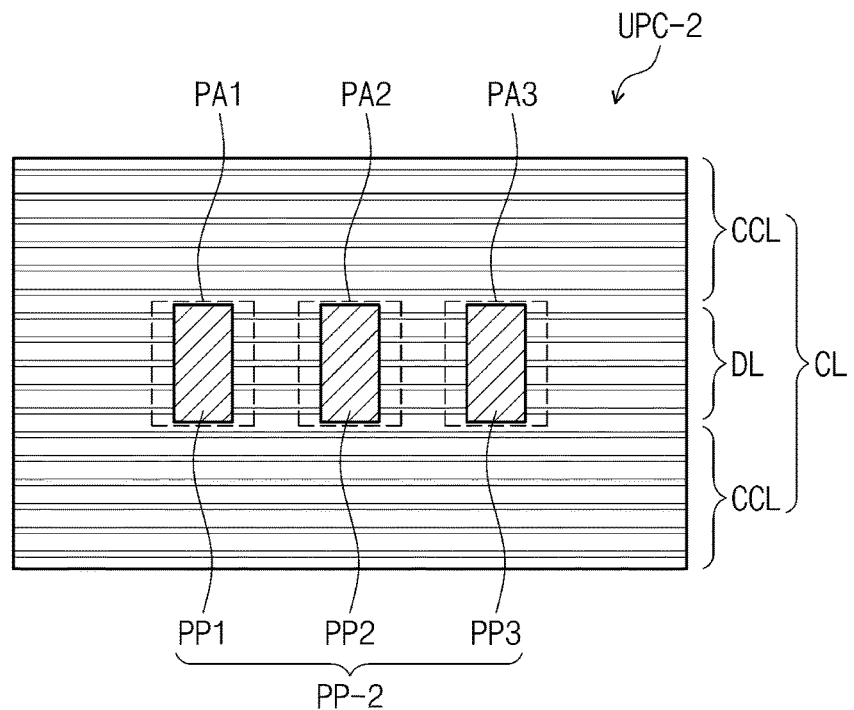
FIG. 13 is an enlarged plan view of a unit film according to another embodiment of the present disclosure.

FIG. 13 is an enlarged plan view of a unit film according to another embodiment of the present disclosure.

For convenience of description, differences between the present embodiment and the foregoing embodiments will be mainly described, and omitted descriptions may be derived from the foregoing embodiment embodiments. Also, the same reference symbols are given to the same components, respectively, and duplicated descriptions will be omitted.

Referring to FIG. 13, according to another embodiment of the present disclosure, a plurality of detection areas PA1, PA2, and PA3 may be defined on a unit film UPC-2. The plurality of detection areas PA1, PA2, and PA3 are arranged in one direction. However, the embodiment of the present disclosure is not limited to a position of each of the plurality of detection areas PA1, PA2, and PA3.

An apparatus for manufacturing a flexible film according to the present embodiment may further include a plurality of process units. The process units may one-to-one correspond to the plurality of detection areas PA1, PA2, and PA3. Also, the plurality of process units may correspond to the detection areas PA1, PA2, and PA3, respectively.

Each of the process units may be at least one of a punch press and a sensor. The present embodiment is not specifically limited to types of, or the functionality of, the process units.

A detection pattern PP-2 of the unit film UPC-2 according to the present embodiment may be provided in plurality. The plurality of detection patterns PP1, PP2, and PP3 may be located to one-to-one correspond to the detection areas PA1, PA2, and PA3. Here, one detection pattern (for example, the detection pattern PP2) of the detection patterns PP-2 may have the same configuration as the detection pattern PP of previous embodiments described with reference to FIGS. 4 to 11. The remaining detection patterns PP1 and PP3 except for the mentioned detection pattern PP2 may be defined as sub-detection patterns.

Each of the sub-detection patterns PP1 and PP3 may include identification information of the film area FA (see FIG. 4) on which each of the corresponding sub-detection patterns PP1 and PP3 is formed. For example, the identification information may be a serial number of the film area FA, a type and use of the circuit line, and the like.

Figure 14:
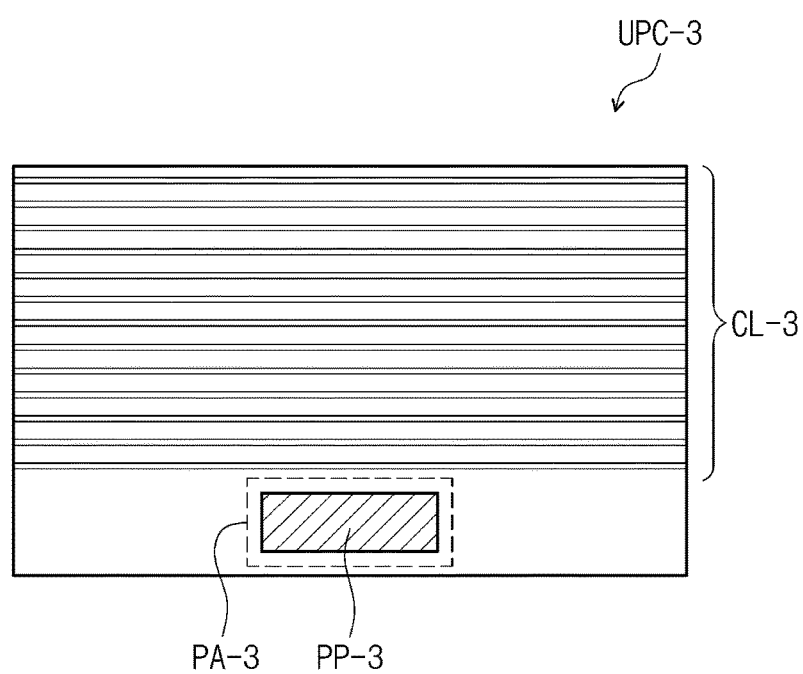
FIG. 14 is an enlarged plan view of a unit film according to another embodiment of the present disclosure.

FIG. 14 is an enlarged plan view of a unit film according to another embodiment of the present disclosure.

For convenience of description, differences between the present embodiment and the foregoing embodiments will be mainly described, and omitted descriptions may be derived from the descriptions of the foregoing embodiments. Also, the same reference symbols are given to the same components, respectively, and duplicated descriptions will be omitted.

Referring to FIG. 14, a detection area PA-3 of a unit film UPC-3 according to another embodiment of the present disclosure might not be defined at a central portion of the unit film UPC-3, but may instead be defined at one side of the unit film UPC-3. In this case, because the above-described circuit line areas CLA are not provided in plurality, the process S2 (see FIG. 3) of detecting defects by using the above-described probe 300 (see FIG. 1) may be simplified.

Figure 15:
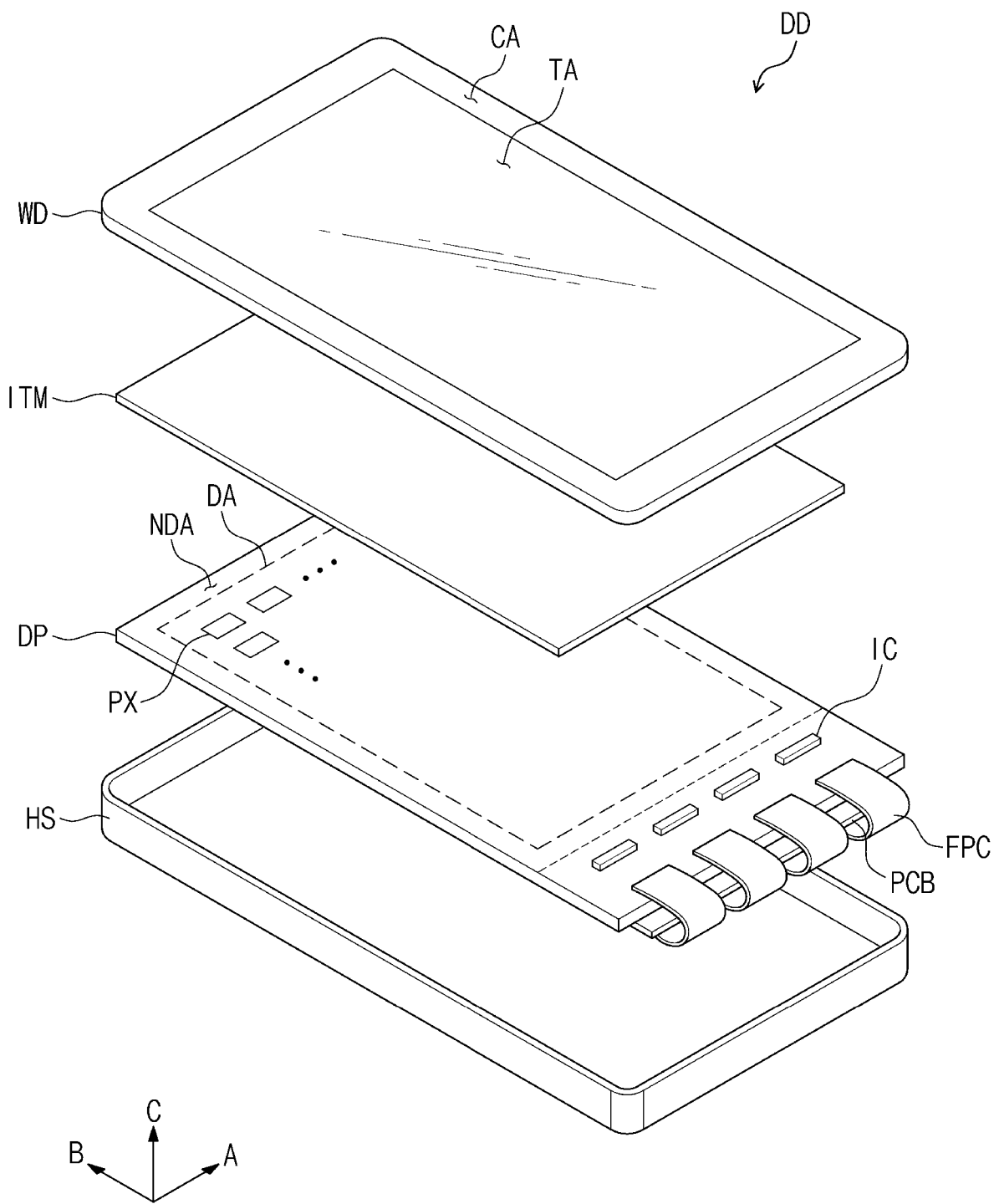
FIG. 15 is an exploded perspective view of a display device including the flexible film according to an embodiment of the present disclosure.
Figure 16:
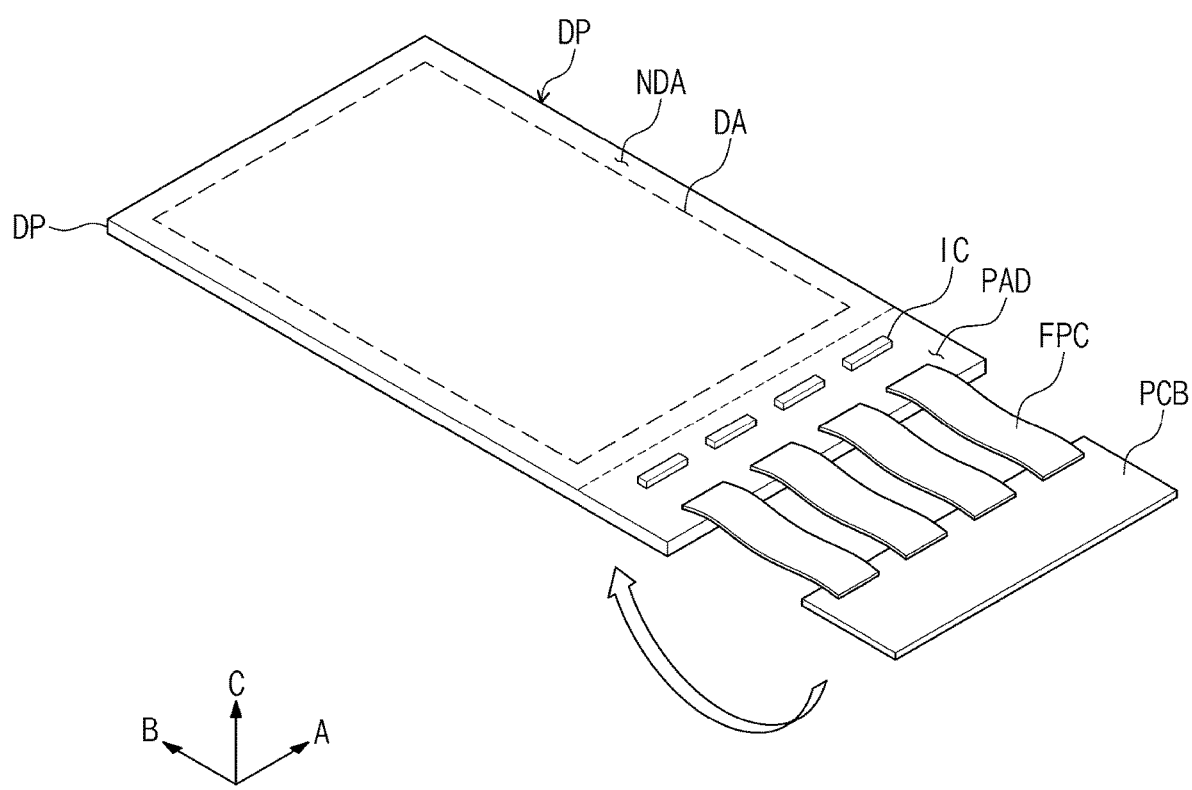
FIG. 16 is a perspective view of the display panel, the flexible film, and a printed circuit board, which are illustrated in FIG. 15.

FIG. 15 is an exploded perspective view of a display device including the flexible film according to an embodiment of the present disclosure, and FIG. 16 is a perspective view of the display panel, the flexible film, and a printed circuit board, which are illustrated in FIG. 15.

The flexible film FPC according to an embodiment of the present disclosure may be the above-described unit film UPC (see FIG. 11). The flexible film FPC may be applied to various display devices. Hereinafter, a case in which the flexible film FPC is applied to an organic light emitting display device DD will be described as an example in FIGS. 15 and 16.

Referring to FIGS. 15 and 16, the display device DD according to an embodiment of the present disclosure includes a window member WD, an intermediate member ITM, a display panel DP, a plurality of flexible films FPC, a printed circuit board PCB, and an accommodation member (e.g., a housing) HS.

The window member WM may include a light transmitting area TA that transmits an image provided from the display panel DP, and a light blocking area CA that is located adjacent the light transmitting area TA and through which the image is not transmitted. The light transmitting area TA is defined at a central portion of the display device DD on a plane defined by A and B directions.

The light blocking area CA has a frame shape that is located in the vicinity of the light transmitting area TA to surround the light transmitting area TA. The light blocking area CA may have a predetermined color. The shape of the light transmitting area TA may be substantially defined by the light blocking area CA.

The display panel DP is located below the window member WD. In the present embodiment, the display panel DP may be an organic electro luminescence display panel. However, the embodiments of the present disclosure are not limited to the type of display panel DP.

A display area DA and a non-display area NDA are defined on a plane of the display panel DP. The display area DA may correspond to the light transmitting area TA of the window member WD.

An image is displayed on the display area DA. For example, the display panel DP may include a plurality of pixels PX located on the display area DA to emit light for generating the image. The pixels PX may be arranged in the form of a matrix within the display area DA. The pixels PX emit light according to an electrical signal.

The non-display area NDA has a frame shape surrounding the display area DA. The non-display area NDA corresponds to the light blocking area CA of the window member WD. The non-display area NDA may include a pad area defined at an edge of the non-display area NDA. The pad area may be an area connected to the printed circuit board PCB. The display panel DP may be electrically connected to another device through the pad area.

The display panel DP may further include an input-sensing member. That is, the display panel DP may sense an external input. An input signal may include various types of inputs provided from the outside of the display device DD. For example, the input signal includes various types of external inputs such as a portion of user's body, light, heat, a pressure, or the like. In the present embodiment, the input signal may be a touch signal.

According to another embodiment of the present disclosure, the input-sensing member may be separated from the display panel DP, and may be located above the display panel DP. Also, according to another embodiment of the present disclosure, the input-sensing member may be omitted.

The intermediate member ITM is located between the window member WD and the display panel DP. The intermediate member ITM may be an anti-reflection member. The anti-reflection member may reduce or prevent light incident into the display device DD from the outside from being reflected by the display panel DP to be visible to the user. For example, the anti-reflection member may include a polarizing layer and a phase retardation layer.

The accommodation member HS is located on a rear surface of the display panel DP. The accommodation member HS may be coupled to the window member WD to define the rear surface of the display device DD. The accommodation member HS may be coupled to the window member WD to define an inner space. The display panel DP, the intermediate member ITM, and various kinds of electronic components or optical components may be accommodated in the inner space. The accommodation member HS may include a material having relatively high rigidity. For example, the accommodation member HS may include a plurality of frames and/or plates, which are made of glass, plastic, and metal. The accommodation member HS may stably protect the components of the display device DD accommodated in the inner space against an external impact.

The printed circuit board PCB is located below the display panel DP. A plurality of driving elements for driving the display panel DP may be mounted on the printed circuit board PCB. In addition, the driving elements may also be mounted on a flexible film FPC that will be described later. As illustrated in FIG. 15, driving elements IC may also be mounted on the non-display area NDA of the display panel DP.

The flexible film FPC may be provided in plurality to connect the display panel DP to the printed circuit board PCB. The flexible films FPC electrically connect the display panel DP to the printed circuit board PCB. For example, each of the flexible films FPC may have one end connected to the display panel DP, and the other end connected to the printed circuit board PCB. Each of the flexible films FPC has flexibility. Thus, the flexible films FPC may be bent downward.

The embodiments of the present disclosure are not limited to the number of flexible films FPC. For example, according to another embodiment of the present disclosure, a single flexible film FPC may connect the display panel DP to the printed circuit board PCB.

According to the embodiments of the present disclosure, the flexible film may be improved due to improved accuracy of defect detection.

It will be apparent to those skilled in the art that various modifications and variations can be made to the disclosed embodiments. Thus, it is intended that the present disclosure covers the modifications and variations provided they come within the scope of the appended claims and their equivalents. Thus, to the maximum extent allowed by law, the scope of the present invention is to be determined by the broadest permissible interpretation of the following claims and their functional equivalents, and shall not be restricted or limited by the foregoing detailed description.

What is claimed is:

1. A film package comprising:
    a base substrate having light transmission and flexibility, and on which a plurality of film areas are arranged in one direction, the film areas each comprising a line area, and a test area;
    a plurality of circuit lines at the line area; and
    a detection pattern at a test area, comprising a material having a light absorption property, and configured for removal when a defect test determines that a defect exists.

2. The film package of claim 1, further comprising a plurality of dummy lines adjacent the detection pattern and within the test area.

3. The film package of claim 2, wherein the detection pattern has a width that is greater than that of each of the dummy lines.

4. The film package of claim 1, wherein the film package further comprises a plurality of dummy lines at dummy areas.

5. A film package comprising:
    a base substrate having light transmission and flexibility, and on which a plurality of film areas are arranged in one direction, the film areas each comprising a line area and a test area;
    a plurality of circuit lines at the line area; and
    a detection pattern at the test area, and comprising a material having a light absorption property,
    wherein the test area comprises:
        a detection area at which the detection pattern is located; and
        a dummy area adjacent the detection area,
    wherein the film package further comprises a plurality of dummy lines at the dummy area, and
    wherein the dummy lines are spaced from the detection pattern.

6. The film package of claim 1, wherein the detection pattern comprises a same material as each of the circuit lines.

7. The film package of claim 1, wherein the base substrate has a light transmittance of about 30% or more.

8. The film package of claim 1, further comprising a cover member above the circuit lines to cover the circuit lines.

9. The film package of claim 1, further comprising at least one sub-detection pattern at the test area, and comprising identification information of a respective one of the film areas.

10. The film package of claim 1, wherein the line area is provided in plurality, and
    wherein the test area is between respective ones of the plurality of line areas on a plane.

11. The film package of claim 1, wherein the detection pattern comprises a defect test detection pattern.

12. A flexible film comprising:
    a base substrate on which a line area, and a test area adjacent the line area and comprising a detection area, and a pair of dummy areas with the detection area therebetween, are defined, the base substrate having light transmission and flexibility;
    a plurality of circuit lines at the line area; and a detection pattern at the detection area, and comprising a material having a light absorption property.

* * * * *